United States Patent [19]

Dehaine et al.

[11] Patent Number: 4,982,311
[45] Date of Patent: Jan. 1, 1991

[54] PACKAGE FOR VERY LARGE SCALE INTEGRATED CIRCUIT

[75] Inventors: Gerard Dehaine, Chatillon; Karel Kurzweil, Saint-Nom-La-Breteche, both of France

[73] Assignee: Bull S.A., Paris, France

[21] Appl. No.: 250,549

[22] Filed: Sep. 29, 1988

[30] Foreign Application Priority Data

Sep. 29, 1987 [FR] France .................. 87 13416

[51] Int. Cl.$^5$ .................................. H05K 7/20
[52] U.S. Cl. ........................... 361/388; 333/33; 357/51; 357/74; 361/401; 361/414
[58] Field of Search .............. 174/52.1, 52.4; 357/51 X, 74 X, 81; 361/380, 383, 386–388, 401, 410, 408, 414, 306 R, 308, 309, 321 R, 321 C; 333/33, 100

[56] References Cited

U.S. PATENT DOCUMENTS

| 4,249,196 | 2/1981 | Durney | 357/74 |
| 4,577,214 | 3/1986 | Schaper | 357/54 |
| 4,654,694 | 3/1987 | Val | 361/401 |
| 4,724,472 | 2/1988 | Sugimoto | 357/74 |
| 4,744,008 | 5/1988 | Black | 361/401 |
| 4,755,910 | 7/1988 | Val | 361/401 |

Primary Examiner—Gerald P. Tolin
Attorney, Agent, or Firm—Kerkam, Stowell, Kondracki & Clarke

[57] ABSTRACT

A package (10) for very large scale integrated circuit (VLSI) includes an electrically and thermally conductive tagboard (20) carrying the chip (12); supply terminals (15a) receiving a first supply potential; an interconnect structure (16) made of ceramic which surrounds the chip (12) and carries both the signal terminals (14) of the package (10) and the supply terminals (15b) receiving a second supply potential, the interconnect structure (16) incorporating the signal and supply conductors intended for the chip (12); and a decoupling device (17) including capacitors (19) and two conductor faces (18a, 18b) connected respectively to the supply terminals (15a, 15b). The decoupling by the capicitors (19) is thus done as close as possible to the conductor faces (18a and 18b) and as close as possible to the chip (12) at the level of islets (32a, 32b).

9 Claims, 4 Drawing Sheets

PACKAGE FOR VERY LARGE SCALE INTEGRATED CIRCUIT

FIELD OF THE INVENTION

The invention relates to a package for a very large scale integrated circuit, also known as a VLSI circuit or chip.

BACKGROUND OF THE INVENTION

The invention is applicable in electronics, for mounting an integrated circuit in a signal processing device, and more particularly for connecting an integrated circuit to a printed circuit board (PC board) of such an apparatus. Ordinarily, a VISI chip is mounted in a package comprising at least one thermally conductive tagboard supporting the integrated circuit; input/output terminals; and an interconnect structure comprising conductors connecting the input/output terminals of the package to the integrated circuit. Among the input/output terminals of the package, the signal terminals are distinguished from the supply terminals intended for receiving various predetermined external electrical potentials. Similarly, in the interconnect structure, the signal conductors are distinguished from the supply conductors, which serve to route the supply potentials to the integrated circuit.

A package for a VLSI chip must meet very stringent conditions. On the one hand, the reactive component of the supply conductors must be reduced to a minimum. This is ordinarily done by a decoupling device incorporated in the package. The decoupling device ordinarily includes conductor faces, which are connected to the plates of at least one decoupling capacitor and respectively receive the various potentials applied to the supply terminals of the package. Effective decoupling is done at the level of the connection points of the conductor faces with the conductors connected to the capacitor. Taking into account the very low self-induction of the conductor faces, it follows that the decoupling takes place virtually at the level of the connection points of the conductor faces with the supply conductors of the interconnect structure. Hence in order to comprise very short connections, the closer these connection points are to the integrated circuit, the more efficient the decoupling; on the other hand, the decoupling is more efficient, the greater the capacitance of the capacitor, the lower its internal self-induction, and the lower the self-induction of its connections with the conductor faces. Generally, a function of low ohmic resistance distribution of the supply potentials, by the intermediary of the supply conductors. is added to the action of the decoupling device upon the supply conductors. This function is essentially performed by the conductor faces of the decoupling device, which make the package virtually insensitive to variations in the energy required for good functioning of the integrated circuit. On the other hand, the package must be as inexpensive as possible, which in turn requires elements that are simple to construct and assemble. Secondarily, other conditions may be required, such as that the disconnectable.

One known provision intended to meet these conditions is described in European patent application No. 0 166 634. The package is of the "chip carrier" type, including a thermally conductive tagboard supporting the integrated circuit; signal terminals and supply terminals; an interconnect structure in the form of a multilayer ceramic frame supported by the tagboard and surrounding the integrated circuit; and a decoupling device comprising a ceramic cap that covers the frame of the interconnect structure and includes conductor faces connected to at least one decoupling capacitor and to the peripheral connection points of the innerconnect structure. Thus these points are geometrically distant from the integrated circuit over the entire width of the frame, such that the electrical length of the supply conductors remains relatively great, resulting in an increased reactive component (both capacitive and inductive), which is prejudicial to the good functioning of the integrated circuit. The structure of this package also proves to be relatively complex and hence expensive, as well as bulky. It should also be noted that this package is not well suited to refrigeration of the integrated circuit. A good adaptation would necessitate disposing the input/output terminals of the package toward the printed decoupling circuit and would complicate the structure of the package considerably.

This prior art document more generally illustrates the problems encountered with the use of ceramic to make a highperformance package for a very large scale integration circuit. One problem is shrinkage of the co-fired ceramic, which limits the precision with which the conductors can be positioned in a conductive layer of a ceramic interconnect structure. However, ceramic is often a preferred material, because of its good electrical characteristics, its sturdiness and the tight sealing that it provides.

SUMMARY OF THE INVENTION

The invention presents a solution to these problems that provides a very large scale integrated circuit package with efficient decoupling as close as possible to the integrated circuit, which is simple and compact in structure and is well adapted to ceramic, and which allows easy refrigeration of the integrated circuit. Consequently, a package according to the invention can easily be manufactured on a large scale, at less cost.

According to the invention, a package for a very large scale integrated circuit, including a thermally conductive tagboard supporting the integrated circuit, signal terminals and supply terminals, an interconnect structure carried by the tagboard and surrounding the integrated circuit, and a decoupling device including conductor faces coupled to at least one decoupling capacitor and connected to the supply terminals and to the interconnect structure at a plurality of connection points, is characterized in that the interconnect structure incorporates the decoupling device.

The characteristics and advantages of the invention will become apparent from the ensuing description, given by way of example and taken in conjunction with the accompanying drawings.

DESCRIPTION OF THE PREFERRED EMBODIMENTS

Figure 1:
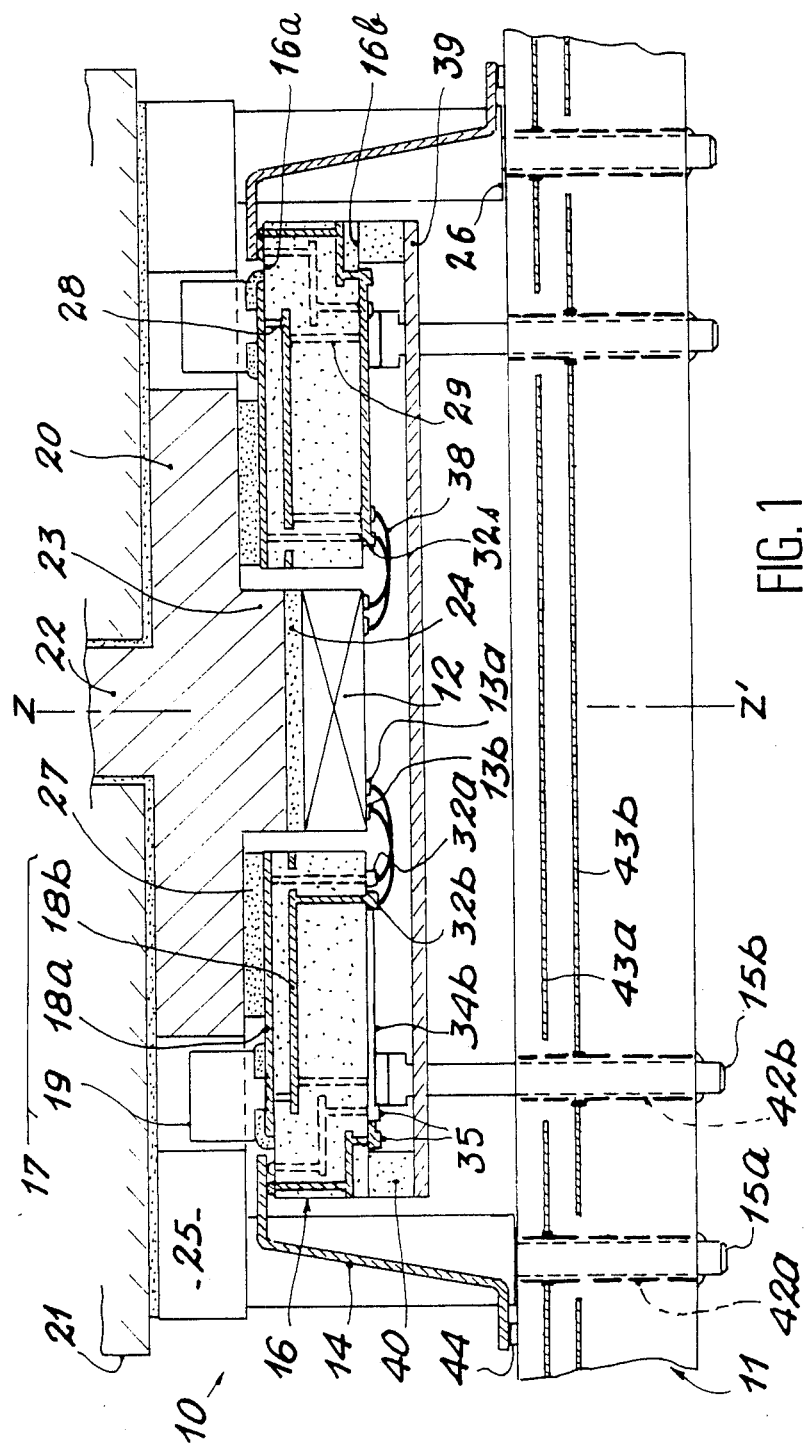
FIG. 1 is a cross-sectional view of a package for a very large scale integrated circuit according to the invention, which is mounted on a printed circuit board shown in part and schematically.
Figure 2:
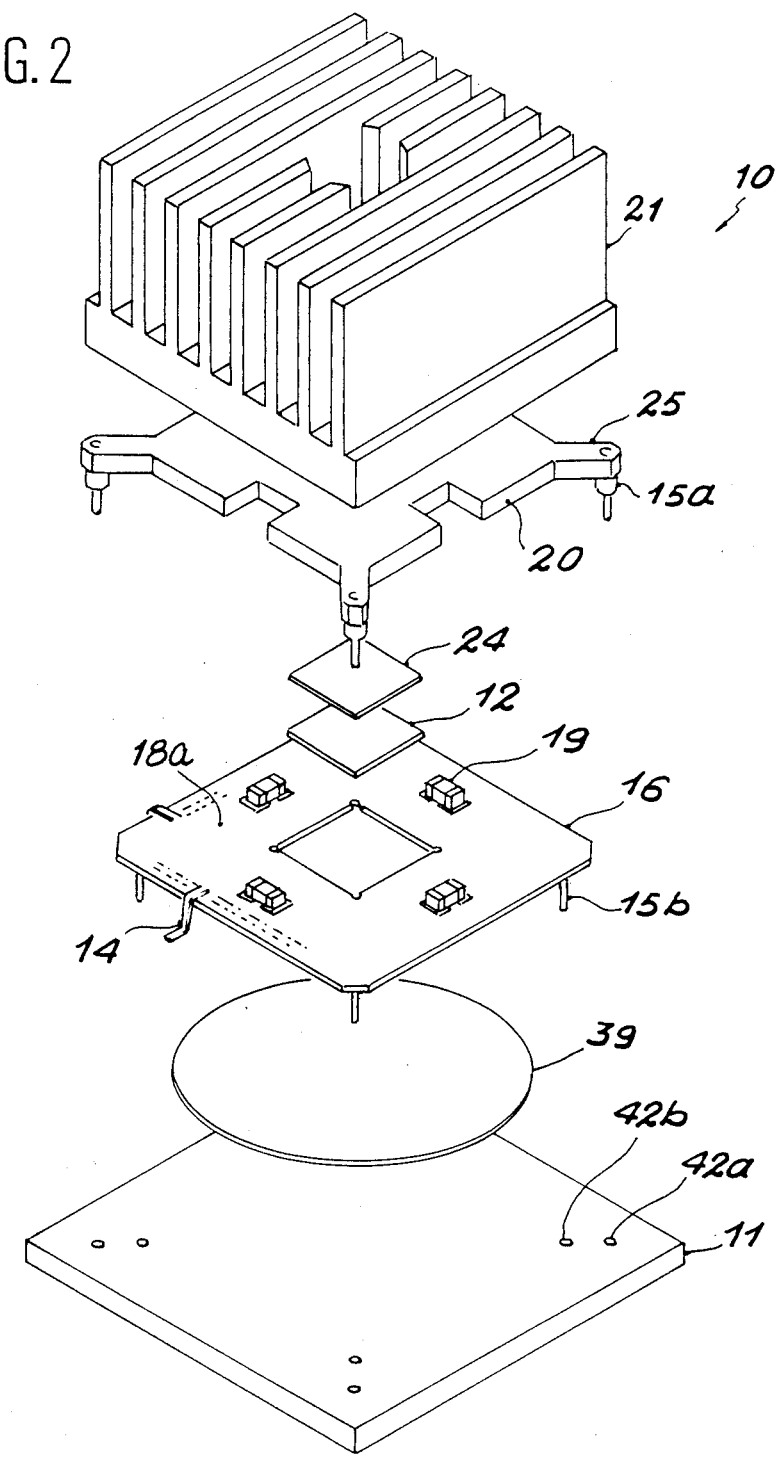
FIG. 2 is an exploded perspective view of the package and board shown in FIG. 1.
Figure 3:
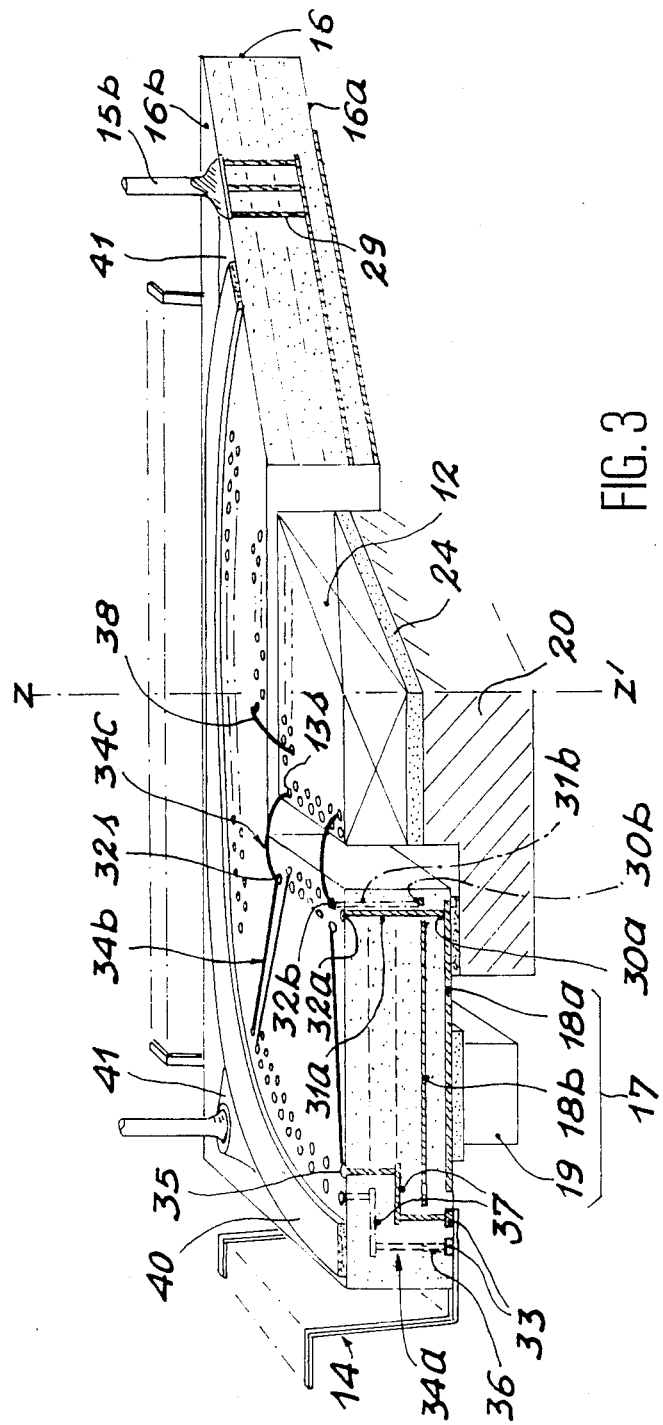
FIG. 3 is a view of a detail on a larger scale, shown in median cross section and diagonal cross section, of the package shown in FIGS. 1 and 2.

FIGS. 1, 2 and 3 illustrate an exemplary embodiment of a package 10 according to the invention, shown in its final position of connection with a printed circuit board 11, shown schematically and in part.

The package 10 is designed for encapsulating a very large scale integrated circuit 2, currently known as a chip. At present, the chip 12 is ordinarily a thin slab, at least 1 mm in thickness and of substantially square shape about 1 cm on a side. The axis Z'Z is the perpendicular straight line to the chip 12 at its center. Its active face has input/output terminals 13 at the edge disposed in zig-zag fashion, as shown, or in a row. The terminals 13 comprise signal input/output terminals 13s, and first and second supply terminals 13a, 13b intended to receive two different potentials Va, Vb, respectively, for supplying the chip 12 with energy. For example, the potential Va represents ground and the potential Vb forms a voltage of +5 V with respect to ground.

The package 10 of the chip 12 substantially comprises signal terminals 14; supply terminals 15 distributed in two groups 15a, 15b to receive the two potentials Va and Vb, respectively; an interconnect structure 16 formed by 11 the conductors necessary for connection between the terminals 13 of the chip 12 and the signal terminals 14 and supply terminals 15 of the package 10; a decoupling device 17 incorporated in the interconnect structure 16, and made of two conductor face 18a, 18b coupled respectively to the potentials Va, Vb, and to the plates of four decoupling capacitors 19; and a thermally and electrically conductive tagboard 20 serving to support the chip 12 and the interconnect structure 16 and comprising a thermal interface with a refrigeration device such as the radiator 21.

In the package 10 shown, the tagboard 20 is a substantially rigid square plate coaxial with the axis Z'Z and having a surface area greater than that of the chip 12, so as to serve as a support for the interconnect structure 16 as well. The tagboard 20 used is a copper plate 15 mm on a side and 2 mm thick. It is provided with a column 22 coaxial with the axis Z'Z and designed for fixation of the radiator 21. On its other side, it has a boss 23 for the fixation of the chip 12, for example by way of a seal of electrically and thermally conductive glue 24. The four sides of the tagboard 20 are cut out in the middle, to accommodate the four capacitors 19. The corners of the tagboard 20 extend along the respective diagonals of the tagboard to form four arms 25 that carry the four supply terminals 15a. The terminals 15a are long posts about 5 mm long, fixed to the ends of the arms 25 perpendicular to the surface of the tagboard 20 that carries the chip 12 and are provided with respective shoulders 26 equidistant from the tagboard 20 for serving as a stop against the board 11 and thus to assure the final connection of the package 10 in the board.

The interconnect structure 16 is a multilayer block of ceramic, substantially in the shape of a square frame, about 2 mm thick, 11 mm on a side on the inside square and 27 on a side on the outside square. Its face 16a has the signal terminals for 14 of the package 10 as well as the capacitors 19 and conductor face 18a of the decoupling device 17. The conductor face 18a is electrically connected to the tagboard 20, advantageously by a layer of solder, such as a silver-copper layer 27 that at the same time assures the fixation of the interconnect structure 16 to the tagboard 20 coaxially with the chip 12. Thus the conductor face 18a receives the potential Va applied to the supply terminals 15a by the intermediary of the tagboard 20 and the layer 27. On the face 16a, one of the plates of each capacitor 19 is connected to the face 18a. The other plate is connected by way of a via 28 to the conductor face 18b immediately underneath the face 18a. The conductor face 18b is connected by vias 29 to four posts fixed orthogonally to the face 16b of the interconnect structure 16 and comprising the supply terminals 15b that receive the potential Vb. These posts are studs, the heads of which have been welded to the outer edges of the corresponding vias 29. On the other hand, the faces 18a and 18b are connected respectively at points 30a and 30b with the vias 31a, 31b that discharge on the islets 32a, 32b disposed on the inside boundary of the face 16b corresponding with the supply terminals 13a, 13b of the integrated circuit 12. The signal terminals 14 are thin wires or strips distributed regularly over each side of the interconnect structure 16. Their ends are curved substantially perpendicular to their median portion so as to be located within planes parallel to the face 16a. The signal terminals 14 are welded at their respective ends to connection zones 33 disposed in zig-zag fashion on two lines parallel to the boundary of the face 16a shown, or optionally are disposed in a single peripheral line.

The set of signal conductors 34 connecting the connection zones to the terminals 13 of the chip 12 is composed of three groups 34a, 34b and 34c. The group 34a connects the connection zones 33 of the face 16a to the corresponding connection zones 35 on the face 16b, by way of the vias 36 and two conductive layers 37 superimposed on one another extending within the structure underneath the two conductor faces 18a and 18b. The connection zones 35 shown are advantageously located in zig-zag fashion on two parallel peripheral lines that are circular and concentric with the axis Z'Z of the chip 12. The second group 34b of signal conductors is spread over the face 16b and connects the connection zones 35 to islets 32s disposed over the inside periphery of the face 16b corresponding with the signal terminals 13s of the integrated circuit 12. Advantageously, the signal islets 32s and the supply islets 32a, 32b have the same disposition and the same spacing as the corresponding terminals 13s, 13a and 13b of the chip 12. The signal conductors of the group 34b are substantially rectilinear radiating wires. Since the islets 32a, 32b and 32s are spaced very closely, the signal conductors 34b cannot at present be made by the co-fired ceramic technique, as the layers 37, for example can be. Hence the conductors 34a are formed after the interconnect structure 16 is made from ceramic. The exemplary embodiments selected have used thin-film technology. A continuous thin film of conductor material, for example based on copper covered with nickel and gold, has been dusted onto the face 16b and then engraved, to obtain the conductors 34b and the islets 32. Finally, the third group 34c of signal conductors is composed of connecting wires 30a connecting the islets 32a, 32b, 32s to the corresponding terminals 13a, 13b, 13s of the chip 12 and welded by the technique known as "wire bonding". To facilitate welding, the chip 12 is mounted on the projection 23 of the tagboard 20 in such a manner that the terminals 13 are substantially coplanar with the islets 32 of the face 16b of the interconnect structure 16.

Finally, the package 10 includes a cap 39 intended primarily to assure the hermetic sealing of the cavity of the package and to protect the chip 12 mechanically.

The cap 39 shown is a circular metal plate fixed to the face 16b by a seal 40 disposed concentrically with and externally to the connection zones 35. Advantageously, the cap 39 is of an electrically conductive material, and the seal 40 is a conductive soldering alloy put into contact with a conductive connecting lead 41 connected to at least one of the supply terminals 15b of the face 16b. The connecting leads 41 shown are extensions of the outer edges of the vias 29 to which the supply terminals 15b are affixed. The cap 39 is thus attached to the conductor face 18b.

FIG. 1 also shows the mounting of the package 10 on the board 11. The board 11 is provided with connection holes 42a, 42b located corresponding with the posts 15a, 15b, respectively, of the package 10. The connection holes 42a, 42b are connected in the board 11 with layers 43a, 43b, respectively, for distribution of the supply voltages Va, Vb. On the other hand, the surface of the board 11 facing the package 10 has zones 44 disposed in a row and intended for connection of the free ends of the signal terminals 14 of the package 10. The connection of the package 10 to the board 11 is thus accomplished by plugging the posts 15a, 15b into the connection holes 42a, 42b until the shoulders 26 of the posts 15a come to a stop against the corresponding face of the board 11 and welding the signal terminals 14 to the zones 44.

The advantages of a package according to the invention will be clearly apparent from the foregoing description. The essential advantage is provided by the decoupling device 17, which because of its incorporation into the interconnect structure 16 enables action at the level of the points 30a, 30b in proximity with the chip 12. The lengths of the individual supply conductors relative to the terminals 13a and 13b of the chip 12 are simply the respective sums of the vias 31a, 31b (approximately one millimeter) and of the connection wires 38 (approximately one millimeter) between the islets 32a, 32b and the terminals 13a, 13b. Moreover, the self-induction of the very short connection of the capacitors 19 with the conductor faces 18a and 18b is very low. In the decoupling device 17, electrically connecting the solid tagboard 20 to the conductor face 18a, and the relatively solid cap 39 to the conductor face 18b, also considerably lowers the ohmic resistance of the distribution of the supply potentials Va and Vb and further reduces the reactive component of the package 10. Another considerable advantage of the package 10 is the simplicity of its structure and manufacture, because the decoupling device 17 is incorporated in the interconnect structure 16 and is manufactured in the same manner, by the technology of multilayer co-fired ceramics. It will also be noted that the package 10 remains compact, because the signal conductors 34b are manufactured by thin-film technology, which overcomes the difficulties presented by the ceramic and obtains large scale integration of the conductors in one layer. The tagboard 20 also has the advantage of being capable of polarizing the back face of the chip 12, if the chip is the MOS (metal oxide semiconductor) type, for example. Moreover, the orthogonal mounting of the posts lends the package 10 good strength and makes for minimum bulk. Finally, package 10 is simple to mount on the board 11 and can be made disconnectable. It is sufficient to plug the supply posts 15a, 15b into the board 11 and to weld the signal terminals 14 in the conventional manner to the zones 44 of the board.

Numerous variations can be made in the exemplary embodiment of the package 10 shown in FIGS. 1,2 and 3. In particular, the supply potential Va can also be applied directly to the interconnect structure 16 instead of the tagboard 20 as shown. Among the four posts 15b affixed to the interconnect structure 16 shown in FIGS. 1-3, two first posts may be connected to the potential Va and two second posts can be connected to the potential Vb as before. In this case, the first post 15a will be connected to the conductor face 18a by way of vias similar to the vias 29 shown relating to the second posts 15b. It would no longer be necessary for the tagboard 20 to be electrically conductive. As a variant, the projection 23 may be a separate conductor element from the tagboard 20 but integrally joined to a base that covers the surface of the conductive layer 27. The base would play the role of conductive connection between the conductor face 18a and the back face of the chip 12. Another variant could also comprise affixing the chip 12 to an extension of one of the conductor faces 18a, 18b on the inside of the frame formed by the interconnect structure 16. If the supply terminals 15a, 15b are also integral with the interconnect structure 16, then the tagboard 20 could serve merely as a support and as a thermal interface.

It is also apparent that the number of supply terminals 15a and 15b can be arbitrary. At the extreme, a package 10 according to the invention could have only a single terminal 15a and a single terminal 15b, and in the foregoing variant they can be both be affixed to the interconnect structure 16. The cap 39 could also be connected to the potential Va, instead of its connection as shown to the potential Vb. In the decoupling device 17, the conductor faces 18a, 18b may be disposed in some other manner, for example both being incorporated into the ceramic. This case is conceivable especially when the tagboard 20 does not have to function as a means of electrical connection. Then the tagboard could be made of a ceramic. A single decoupling capacitor 19 would suffice. Moreover, the connecting wires 38 between all the islets 32 and the corresponding terminals 13 of the chips 12 could be rectilinear conductor elements affixed parallel to the active face of the chip 12 (in the manner of "beam leads"). Mounting of this kind could for example be obtained using a TAB (tape automated bonding) tape. On the other side of the interconnect structure, the signal terminals 14 of the package 10 could be disposed on the face 16b, instead of on the face 16a. In the example shown, the disposition of the signal terminals 14 on the face 16a has the advantage of reducing the bulk of the interconnect structure 16. However, taking into account all the variant embodiments of a package according to the invention, it could prove to be wise to dispose the signal terminals 14 on the face 16b. Finally, it is clear that the heat dissipation element 21 may be of another type than the radiator shown, for example being an element for interface with a liquid refrigerant.

Figure 4:
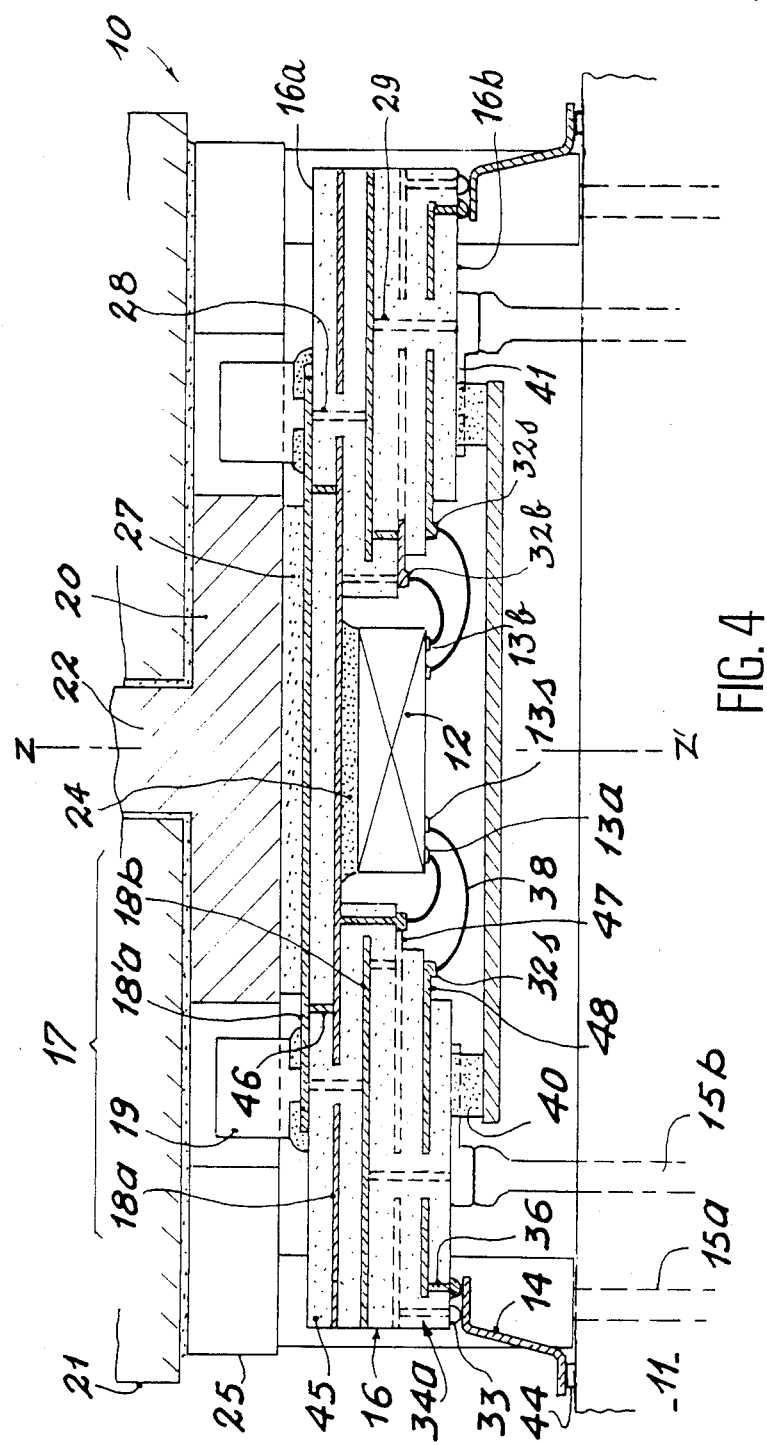
FIG. 4 is a view similar to that of FIG. 1 of a variant embodiment of a package according to the invention.

FIG. 4, in a manner similar to FIG. 1, shows a variant embodiment of a package 10 according to the invention. The elements shared with the package shown in FIGS. 1-3 are identified by the same reference numerals. The essential variant in the embodiment of the package 10 shown in FIG. 4 resides in the configuration of the interconnect structure 16 incorporating the decoupling device 17. The interconnect structure 16 is a block of multilayer ceramic, in the form of a frame concentric with the axis Z'Z of the chip 12, which includes an additional layer of ceramic 45 covering the face 18a and closing the window formed by the frame of the interconnect structure 16. The face 18a covers the entire layer 45. The chip 12 is glued to the conductor face 18a by the seal of conductive glue 24. The outer face of the layer 45 comprises the face 16a of the interconnect structure 16. This outer face is for the most part covered with a conductive layer comprising an auxiliary conductor face 18'a of the decoupling device 17. The auxiliary face 18'a is connected to the face 18a by way of vias 46 in such a manner as to receive the supply potential Va. The four capacitors 19 rest on the face 16a having one plate connected on the face 16a to the auxiliary face 18'a and the other plate connected to the conductor face 18b by the via 28. As in the foregoing package 10, the conductive layer 27 affixes the interconnect structure 16 to the tagboard 20, while assuring the electrical connection between the auxiliary conductor face 18'a and the supply terminals 15a of the tagboard 20. The layer 27 may again be made of a silver-copper solder. Preferably, a silver-based conductive glue will be used as the glue of the seal 24, because of the convenience of this kind of fixation.

The configuration of the interconnect structure 16 shown in FIG. 4 also differs in the disposition of the islets 32a, 32b and 32s which are connected to the corresponding terminals 13a, 13b and 13s of the chip 12. All the islets 32 are distributed over two steps 47, 48 formed at the inside of the periphery of the interconnect structure 16 coaxially with the axis Z'Z. The lower step 47 next to the chip 12 advantageously includes all the supply islets 32a, 32b representing the supply potentials Va, Vb. The conductor faces 18a, 18b of the decoupling device 17 are thus connected respectively, at the connection points 30a and 30b, to the vias 31a and 31b discharging at the islets 32a and 32b distributed over the lower step 47. Thus the length of the connection wires 38 between the islets 32a, 32b and the terminals 13a, 13b of the chip 12 is quite short with respect to the other wires associated with the upper step 48, and contributes to reducing their intrinsic reactive component. The signal islets 32s occupy the upper step 48 and are complementary to the lower step 47 such that the disposition of all the islets 32 corresponds with that of all the terminals 13 of the chip 12. Preferably, all the islets 32 will have the same spacing as the terminals 13 of the chip 12.

Finally, the interconnect structure 16 shown in FIG. 4 has the characteristic of carrying all the signal terminals 14 on its face 16b near the card 11. The signal terminals 14 comprise a set of pins (also known as a lead frame), as in the foregoing package. However, it will be more advantageous to mount them by TAB technology, which is a simple, compact and reliable method, because of the possible presence of an insulating strip connecting the free ends of the signal terminals to one another.

It should also be noted that all the signal conductors conducting the signal terminals 14 to the islets 32s are entirely incorporated within the ceramic and consequently are produced by the co-fired ceramic technique. In other words, the manufacture of the interconnect structure 16 shown in FIG. 4 does not necessitate using the thin-film technique that was required to make the conductors 34b on the face 16b.

The package 10 shown in FIG. 4 comprises the preferred embodiment of the invention. The interconnect structure 16 is manufactured by the conventional co-fired ceramic technique. It is very compact. Moreover, it can be equipped with the chip 12 independently of the tagboard 20, such that advantageously, the interconnect structure 16 is equipped with the chip 12, its connecting wires 38, the cap 39 and the capacitors 19 first, and then the equipped interconnect structure 16 is fixed to the tagboard 20, by means of the layer 27.

It will be understood that all the variant embodiments mentioned above with reference to the package 10 shown in FIGS. 1–3 are equally applicable to the package 10 shown in FIG. 4. In the latter package, however, it will be noted that the conductor face 18a substantially has the function of polarizing the back face of the chip 12. Consequently, if the chip does not require such polarization, then the face 18a can be omitted and replaced by the auxiliary conductor face 18'a. Moreover, the set of islets can be distributed over more than two steps, or on only one step, in which case they would then be zig-zagged. These possibilities depend in particular on the desired density of the islets 32 and on the adaptation of the co-fired ceramic to this density.

What is claimed is:

1. A package (10) with a semiconductor chip (12), comprising signal terminals (14) and supply terminals (15a, 15b) for outer connection of the package, a thermally conductive tagboard (20) supporting the chip, a multilayered interconnect structure (16) carried by the tagboard and at least partially surrounding the chip, said interconnect structure including: a decoupling device (17) comprising capacitor means (19) and superimposed conductor planes (18a, 18b) connected to said supply terminals; outer islets (32a, 32b, 32s) disposed in proximity with the chip and comprising supply islets (32a, 32b) connected to the corresponding conductor planes (18a, 18b) and signal islets (32s) being the ends of radiating conductors of a conductive layer (34b) formed on a face of the interconnect structure and connected to the respective signal terminals (14).

2. A package as defined by claim 1, wherein the conductive layer (34b) is a thin-film layer.

3. A package as defined by claim 1, wherein the conductive layer (34b) is connected to the signal terminals (14) of the package via at least one other conductive layer (37) of the interconnect structure.

4. A package as defined by claim 1, wherein the radiating conductors have outer peripheral ends (35) connected to the respective signal terminals of the package via at least one other conductive layer (37) of the interconnect structure.

5. A package as defined by claim 1, wherein the interconnect structure is a multilayered block of ceramic.

6. A package as defined by claim 1, wherein the interconnect structure (16) is a multilayered block of ceramic carrying said signal terminals (14) and at least one of said supply terminals (15a, 15b) of the package.

7. A package as defined by claim 1, wherein said tagboard (20) is made of an electrically conductive material and carries those of said supply terminals which are related to a first supply potential (Va) and the interconnect structure (16) carries said signal terminals (14) and the other supply terminals (15b).

8. A package as defined by claim 6, wherein the supply terminals (15a, 15b) are metal posts mounted parallel to the axis (Z'Z) of the chip.

9. A package as defined by claim 7, wherein the supply terminals (15a, 15b) are metal posts mounted parallel to the axis (Z'Z) of the chip.

* * * * *